(12) United States Patent
Takeda

(10) Patent No.: US 6,414,381 B1
(45) Date of Patent: Jul. 2, 2002

(54) INTERPOSER FOR SEPARATING STACKED SEMICONDUCTOR CHIPS MOUNTED ON A MULTI-LAYER PRINTED CIRCUIT BOARD

(75) Inventor: Hisashi Takeda, Suzaka (JP)

(73) Assignee: Fujitsu Media Devices Limited, Suzaka (JP)

( * ) Notice: Subject to any disclaimer, the term of this patent is extended or adjusted under 35 U.S.C. 154(b) by 0 days.

(21) Appl. No.: 09/495,699

(22) Filed: Feb. 1, 2000

(30) Foreign Application Priority Data

Mar. 15, 1999 (JP) .......................................... 11-069013

(51) Int. Cl.[7] .......................................... H01L 23/495
(52) U.S. Cl. ...................... 257/676; 257/686; 257/724; 257/787; 361/723; 361/774; 361/813
(58) Field of Search ................................ 257/666, 670, 257/672, 676, 685, 686, 787, 690, 678, 723, 724; 361/723, 774, 813

(56) References Cited

U.S. PATENT DOCUMENTS

| | | | | |
|---|---|---|---|---|
| 5,172,303 A | * | 12/1992 | Bernardoni et al. | ........ 361/396 |
| 5,237,204 A | * | 8/1993 | Val | .............................. 257/698 |
| 5,748,452 A | * | 5/1998 | Londa | ......................... 361/790 |
| 5,784,264 A | * | 7/1998 | Tanioka | ....................... 361/803 |
| 5,864,062 A | * | 1/1999 | Nagahara et al. | ......... 73/514.01 |
| 5,963,430 A | * | 10/1999 | Londa | ......................... 361/790 |
| 6,201,294 B1 | * | 3/2001 | Lee | .............................. 257/669 |
| 6,297,548 B1 | * | 10/2001 | Moden et al. | ............... 257/686 |
| 6,313,522 B1 | * | 11/2001 | Akram et al. | ................ 257/686 |
| 6,316,727 B1 | * | 11/2001 | Liu | ............................ 174/52.4 |

FOREIGN PATENT DOCUMENTS

| JP | 63-261736 | * 10/1988 |
|---|---|---|
| JP | 3-268457 | 11/1991 |
| JP | 4-144269 | 5/1992 |
| JP | 5-183103 | * 7/1993 |
| JP | 10-12810 | 1/1998 |
| JP | 10-84076 | 3/1998 |

* cited by examiner

*Primary Examiner*—David L. Talbott
*Assistant Examiner*—Alonzo Chambliss
(74) *Attorney, Agent, or Firm*—Armstrong, Westerman & Hattori, LLP

(57) ABSTRACT

A semiconductor device includes a first semiconductor chip, a second semiconductor chip, a multilayer printed circuit board having a first surface whereon the first semiconductor chip is mounted and a second surface whereon external connection terminals are provided, an interposer, and a sealing resin for sealing the first and second semiconductor chips. The interposer holds the second semiconductor chip above the first semiconductor chip such that there is a separation between them while electrically connecting the second semiconductor chip and the multilayer printed circuit board. The sealing resin is formed so as to fill the separation between the first and second semiconductor chips.

6 Claims, 6 Drawing Sheets

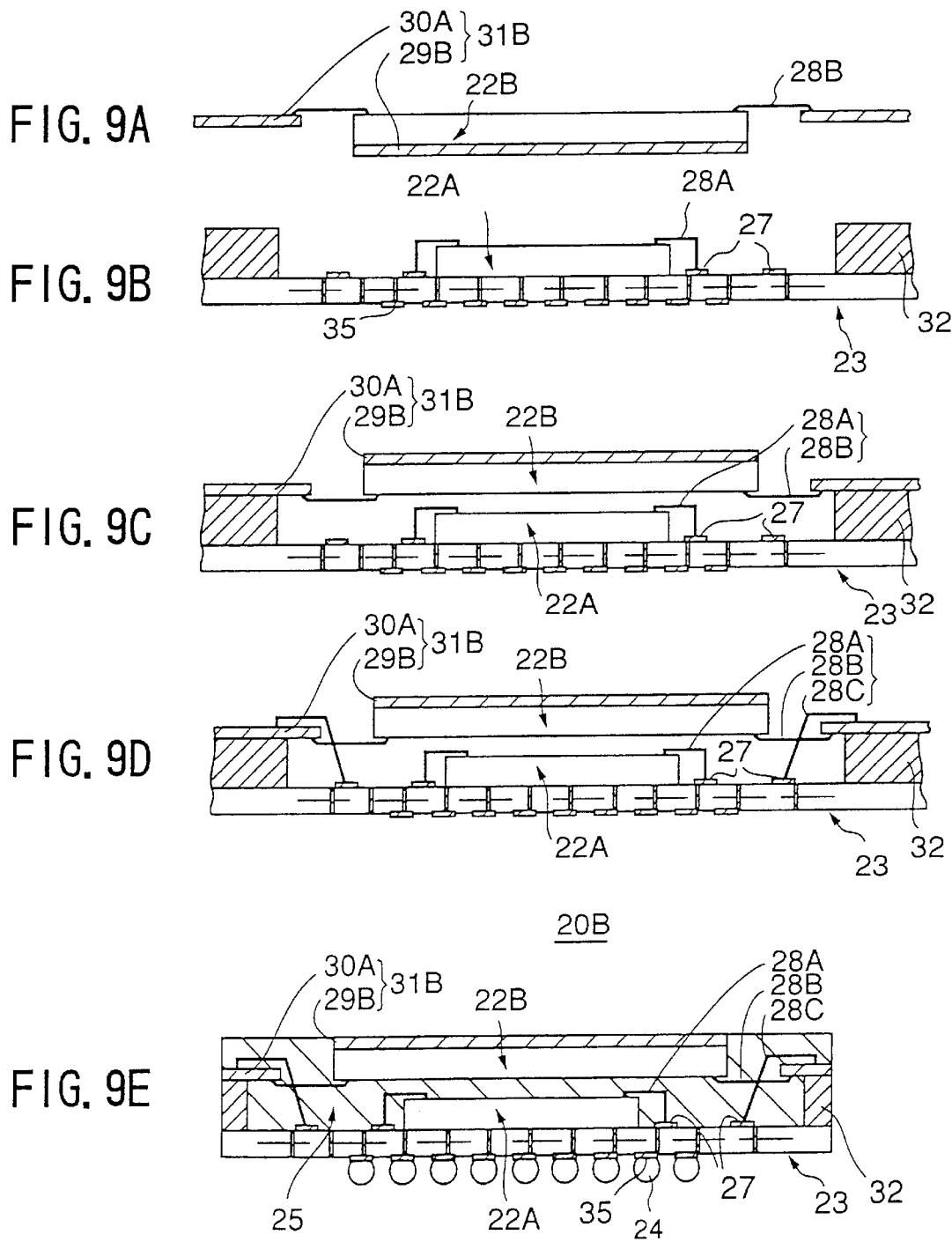

INTERPOSER FOR SEPARATING STACKED SEMICONDUCTOR CHIPS MOUNTED ON A MULTI-LAYER PRINTED CIRCUIT BOARD

BACKGROUND OF THE INVENTION

1. Field of the Invention

The present invention generally relates to a semiconductor device and a method of manufacturing thereof, and particularly relates to a semiconductor device having a plurality of semiconductor chips provided in a stacked structure and a method of manufacturing thereof.

Recently, in the field of semiconductor devices, there is an increasing need for a high density mounting method for providing smaller, thinner, and lighter structures. In order to satisfy the above need, semiconductor devices of a Multi Chip Module (MCM) structure have become of great interest.

The mounting level of the MCM is substantially the same as that of a Chip Size Package (CSP). Also, with the MCM, a plurality of semiconductor chips is mounted on a multi-layer printed circuit board by wire bonding or flip-chip bonding.

2. Description of the Related Art

It is known to provide a plurality of semiconductor chips on a multilayer printed circuit board by wire bonding or flip-chip bonding. Such a structure has a drawback in that the area of the multilayer printed circuit board cannot be reduced, since the semiconductor chips are provided on the multilayer printed circuit board in a two-dimensional manner.

Also, it is known to provide a plurality of semiconductor chips on both sides of a multilayer printed circuit board. Such a structure has a drawback in that a sealing resin must be provided on both sides of the multilayer printed circuit board.

Further, it is known to provide a plurality of semiconductor chips on a single layer printed circuit board in such a manner that the semiconductor chips are stacked directly on each other. Such a structure has a drawback that the semiconductor chips will interfere with each other. Also, inexpensive general-purpose semiconductor chips cannot be used in such a semiconductor devices, since their predetermined pin layout may cause an interference between the wires.

SUMMARY OF THE INVENTION

Accordingly, it is a general object of the present invention to provide a semiconductor device that can solve the above problems.

It is another and more specific object of the present invention to provide a semiconductor device having a reduced size, an improved mounting reliability and the ability to use general-purpose semiconductor chips.

In order to achieve the above objects according to the present invention, the semiconductor device includes:

a first semiconductor chip;

a second semiconductor chip;

a multilayer printed circuit board having a first surface whereon the first semiconductor chip is mounted and a second surface whereon external connection terminals are provided;

an interposer; and a sealing resin for sealing the first and second semiconductor chips, wherein the interposer holds the second semiconductor chip above the first semiconductor chip such that there is a separation between the first semiconductor chip and the second semiconductor chip while electrically connecting the second semiconductor chip and the multilayer printed circuit board, and the sealing resin is formed so as to fill the separation between the first semiconductor chip and the second semiconductor chip.

With the semiconductor device described above, the size of the semiconductor device can be reduced since the second semiconductor chip is held above the first semiconductor chip such that there is a separation between the first semiconductor chip and the second semiconductor chip. Also, since there is no need to provide wirings on the interposer at a position peripheral to the multilayer printed circuit board, general-purpose semiconductor chips can be used. Therefore, the cost of the semiconductor device can be reduced. Further, in the sealing resin, the first semiconductor chip and the second semiconductor chip are held with a separation between each other. Therefore, the semiconductor chips will not interfere with each other, and there liability of the semiconductor device can be improved.

It is still another object of the present invention to provide a method of manufacturing the above-described semiconductor device.

In order to achieve the above objects according to the present invention, a method of manufacturing a semiconductor device includes comprising the steps of:

a) mounting a first semiconductor chip on an upper surface of a multilayer printed circuit board and electrically connecting the first semiconductor to the multilayer printed circuit board;

b) mounting a second semiconductor chip on a stage of a lead frame and electrically connecting the second semiconductor chip and lead parts of the lead frame by means of first electrical connection parts;

c) holding the lead frame on the multilayer printed circuit board by a holding means such that there is a separation between the second semiconductor chip and the first semiconductor chip;

d) connecting the lead parts and the multilayer printed circuit board by means of second electrical connection parts;

e) forming a sealing resin such that the first semiconductor chip and the second semiconductor chip are sealed and the separation between the second semiconductor chip and the first semiconductor chip is filled with the sealing resin; and f) forming external connection terminals on a lower surface of the multilayer printed circuit board.

With the method described above, the connection step and the resin sealing step can be implemented with the second semiconductor chip being held above the first semiconductor chip with a separation between each other. Therefore, the connection step and the resin sealing step can be implemented quite easily.

Other objects and further features of the present invention will be apparent from the following detailed description when read in conjunction with the accompanying drawings.

BRIEF DESCRIPTION OF THE DRAWINGS

FIGS. 9A to 9E are cross-sectional diagrams showing various steps of manufacturing the semiconductor device of the first embodiment of the present invention.

DETAILED DESCRIPTION OF THE PREFERRED EMBODIMENTS

Before describing the present invention, for the sake of clarity of explanation, four examples of semiconductor device of the related art will be described with reference to FIGS. 1 to 4.

Figure 1:
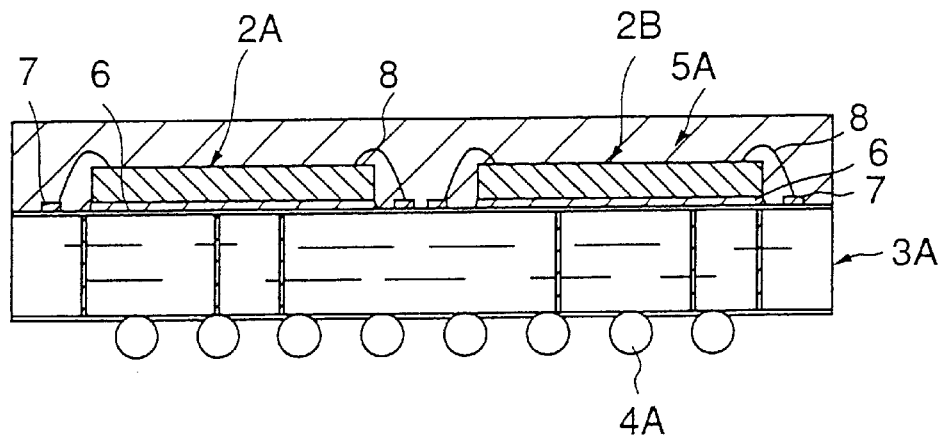
FIG. 1 is a cross-sectional diagram showing a first example of a semiconductor device of the related art.

FIG. 1 is a cross-sectional diagram showing a first example of a semiconductor device 1A of the related art. The semiconductor device 1A has an MCM structure and also has a Ball Grid Array (BGA) structure.

The semiconductor device 1A includes a plurality of (in the figure, two) semiconductor chips 2A, 2B, a multilayer printed circuit board 3A, solder balls 4A, and a sealing resin 5A. As shown in FIG. 1, the plurality of semiconductor chips 2A, 2B is surface mounted on the multilayer printed circuit board 3A. Therefore, the semiconductor device 1A has an MCM structure.

The semiconductor devices 2A and 2B are fixed on an upper surface of the multilayer printed circuit board 3A by means of an adhesive agent 6. Wires 8 are used for wire-bonding the semiconductor devices 2A and 2B with bonding pads 7 provided on the multilayer printed circuit board 3A. Also, the solder balls 4A serving as external connection terminals are provided on a lower surface of the multilayer printed circuit board 3A. The bonding pads 7 and the solder balls 4A are connected via internal interconnections formed in the multilayer printed circuit board 3A. Thus, each of the semiconductor devices 2A and 2B are electrically connected to predetermined solder balls 4A.

Also, the sealing resin 5A is provided on an upper surface of the multilayer printed circuit board 3A, so as to cover the semiconductor chips 2A, 2B and the wires 8. Thus, the semiconductor chips 2A, 2B and the wires 8 are protected by the sealing resin 5A.

Figure 2:
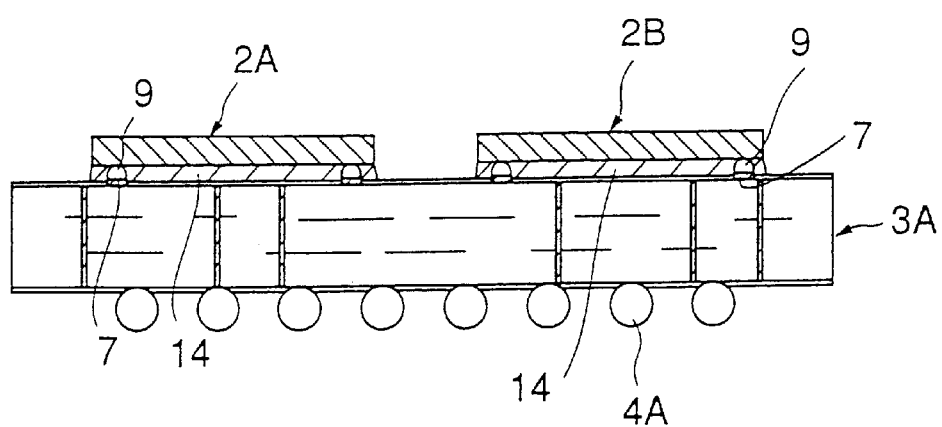
FIG. 2 is a cross-sectional diagram showing a second example of a semiconductor device of the related art.

FIG. 2 is a cross-sectional diagram also showing a second example of a semiconductor device 1B of the related art. The semiconductor device 1B has an MCM structure and also has a Ball Grid Array (BGA) typed structure. The semiconductor device 1B is provided with stud bumps 9 formed on each of the semiconductor chips 2A, 2B. The semiconductor device 1B is flip-chip bonded on the multilayer printed circuit board 3A. Also, in order to mitigate the stress applied on the stud bumps 9, an under-fill resin 14 is provided between each of the semiconductor chips 2A, 2B and the multilayer printed circuit board 3A.

However, with the semiconductor devices 1A and 1B shown in FIGS. 1 and 2, respectively, the plurality of semiconductor integrated circuit chips 2A and 2B are mounted on the multilayer printed circuit board 3A in a two-dimensional arrangement such that the semiconductor chips 2A, 2B are placed side by side. The area of the multilayer printed circuit board 3A cannot be reduced to an area less than the total two-dimensional area of the semiconductor chips 2A, 2B. Therefore, with the semiconductor devices 1A and 1B shown in FIGS. 1 and 2, respectively, there is a problem that the semiconductor devices are voluminous.

Figure 3:
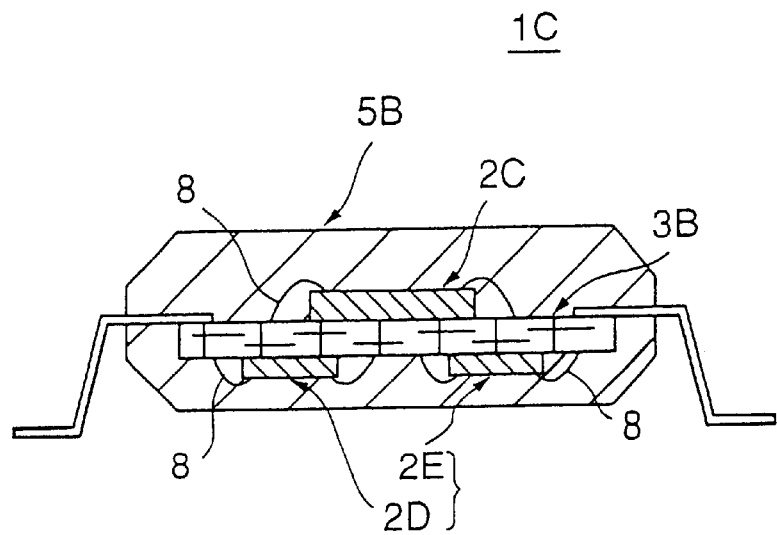
FIG. 3 is a cross-sectional diagram showing a third example of a semiconductor device of the related art.

In order to overcome such a problem, a Quad Flat Package (QFP) type semiconductor device has been proposed in the art. FIG. 3 is a diagram showing a semiconductor device 1C of a QFP type in which semiconductor chips 2C to 2E are provided on both sides of a multilayer printed circuit board 3B. This semiconductor device 1C indeed achieves an increased mounting density. However, since the semiconductor chips 2C to 2E are provided on both sides of the multilayer printed circuit board 3B, it is necessary to provide a sealing resin 5B on both sides of the multilayer printed circuit board 3B. Thus, an increased amount of resin 5B is necessary. As a result, the semiconductor device 1C becomes a "heavy" and "thick" package.

Figure 4:
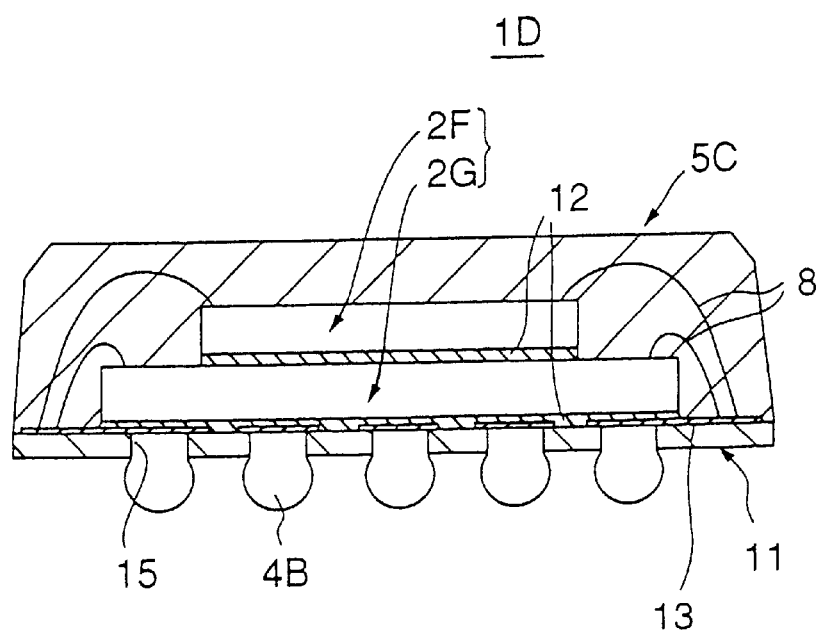
FIG. 4 is a cross-sectional diagram showing a fourth example of a semiconductor device of the related art.

FIG. 4 is a diagram showing a semiconductor device 1D proposed for increasing the mounting density while achieving a "smaller", "thinner" and "lighter" structure. The semiconductor device 1D is a semiconductor package which is often referred to as a stacked CSP. The semiconductor device 1D is provided with a single layer printed circuit board 11 on which a plurality (in the present example, two) of semiconductor chips 2F, 2G is mounted in a directly stacked manner.

The semiconductor chips 2F and 2G are provided such that the circuit forming surfaces are facing upwards. An insulating adhesive agent 12 is used for joining the semiconductor chip 2G and the circuit board 11 and for joining the semiconductor chip 2F and the semiconductor chip 2G. The circuit board 11 is provided with wiring patterns 13 formed on its upper surface. Each semiconductor chip 2F, 2G and the wiring patterns 13 are electrically connected by the wires 8.

Also, solder balls 4B are provided on a lower surface of the circuit board 11. The solder balls 4B are connected to the wiring patterns 13 via holes 15 formed in the circuit board 11. Thus, the semiconductor chips 2F, 2B are electrically connected to the solder balls 4B.

Further, a sealing resin 5C is provided on the upper surface of the circuit board 11. The sealing resin 5C seals the semiconductor chips 2F, 2G and the wires 8. The semiconductor device 1D is constructed such that the semiconductor devices 2F and 2G are stacked on one surface of the circuit board 11. Therefore, the resin 5C is provided on only one surface of the circuit board 11. Thus, a "small", "thin" and "light" package is realized.

However, with the semiconductor device 1D, the semiconductor chip 2F and the semiconductor chip 2G are stacked in a directly joined manner. Thus, there arises a problem that interference may occur between the semiconductor chips 2F and 2G. Such a problem may arise when the semiconductor chips 2F and 2G are joined by the insulating adhesive agent 12 and the sealing resin 5C is formed thereafter, or when the semiconductor device 1D is mounted on a mounting board. In both cases, heat is applied to the semiconductor chips 2F and 2G. If there is a difference between the coefficient of thermal expansion of the semiconductor chip 2F and the coefficient of thermal expansion of the semiconductor chip 2G, the heat produces a stress between the semiconductor chip 2F and the semiconductor chip 2G. This stress may result in a bad connection between the semiconductor chips 2F and 2G, and an adverse effect on the circuit forming surface of the semiconductor chip 2G at an area corresponding to the semiconductor chip 2F.

Since a single layer circuit board 11 is used in the semiconductor device 1D, the wiring pattern 13 has a low degree of freedom of the layout. Therefore, when electrically connecting the semiconductor chips 2F and 2G, it is necessary to provide appropriate wiring patterns 13 and to bond the wires 8 in an appropriate manner. However, when the semiconductor chips 2F, 2G having high-density structures, and thus an increased number of wires, are provided, the distances between neighboring wires are reduced and the degree of freedom of the wire layout is also reduced. Also, as in the semiconductor device 1D, when the plurality of semiconductor chips 2F, 2G is stacked, the degree of freedom will be further reduced.

Therefore, comparatively inexpensive general-purpose semiconductor chips having predetermined pin layouts are not suitable as semiconductor chips 2F, 2G of the semiconductor device 1D because the wires 8 will interfere with each other. In order to avoid this, it is necessary to create new semiconductor chips having such a pin layout that the wires 8 will not interfere with each other.

The present invention is directed to overcome the drawbacks of the semiconductor devices of the related art. In the following, principles and embodiments of the present invention will be described with reference to the accompanying drawings.

Figure 5:
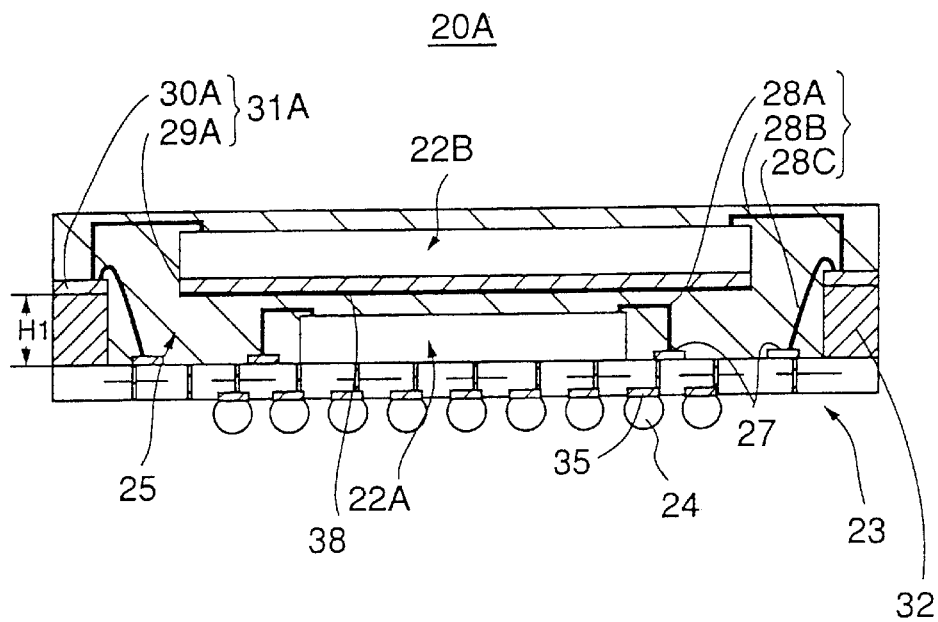
FIG. 5 is a cross-sectional diagram showing a first embodiment of a semiconductor device of the present invention.

FIG. 5 is a cross-sectional diagram showing a first embodiment of a semiconductor device 20A of the present invention. The semiconductor device 20A includes a plurality of (in the present embodiment, two) semiconductor chips 22A, 22B, a multilayer printed circuit board 23, solder balls 24, an interposer and a sealing resin 25. As shown in FIG. 5, the semiconductor chips 22A, 22B are stacked on the multilayer printed circuit board 23. Therefore, the semiconductor device 20A has a structure somewhat resembling the above-described stacked CSP.

A first semiconductor chip 22A is, for example, a system IC and is fixed on an upper surface of the multilayer printed circuit board 23 by an adhesive agent (not shown). The first semiconductor chip 22A is provided with a circuit forming region at the upper surface in the Figure. Electrodes formed on a peripheral part of the circuit forming region and bonding pads 27 formed on the multilayer printed circuit board 23 are connected via wires 28A. Also, a lower surface of the multilayer printed circuit board 23 is provided with a plurality of semiconductor balls 24 serving as external connection terminals.

A second semiconductor chip 22B is, for example, a memory IC such as a DRAM. The second semiconductor chip 22B is held above the first semiconductor chip 22A with a separation between the first and second semiconductor chips 22A and 22B. The second semiconductor chip 22B is electrically connected to the multilayer printed circuit board 23.

The interposer includes a lead frame 31A, wires 28B (first electrical connection parts) and wires 28C (second electrical connection parts). The lead frame 31A has a stage 29A and a plurality of lead parts 30A and is made of a material such as a 42-alloy and copper alloy which are commonly used as a material for leads of semiconductor devices.

A surface of second semiconductor chip 22B which is opposite to the circuit forming surface is joined to the stage 29A by means of an adhesive agent (not shown). Also, the lead frame 31A is provided on one or more dam member 32 which is fixed on the upper surface of the multilayer printed circuit board 23. Therefore, the lead frame 31A is held at a position separated from the multilayer printed circuit board 23 with a predetermined distance Hi shown by an arrow in FIG. 5. Thereby, the second semiconductor chip 22B is held at a position above the first semiconductor chip 22A with a separation between the first and second semiconductor chips 22A and 22B being at a predetermined size (for example, 200 μm).

Also, in the present embodiment, the stage 29A directly opposes the first semiconductor chip 22A. Therefore, an insulating material 38 is provided on the stage 29 on a surface opposing the semiconductor chip 22A. The insulating material 38 may be an insulating resin coated with a predetermined thickness.

With a structure of the present embodiment in which the stage 29A opposes the first semiconductor chip 22A, the wires 28A and the stage 29A will be in close proximity with each other. Therefore, if there is no insulating material between the wires 28A and the stage 29A, there is a risk that the wires 28A and the stages 29A come in contact. Also, the stage 29A is made of a conductive lead material. Therefore, a short-circuited state will occur if the wire 28A touches the stage 29A. This would result in a bad operation of the semiconductor device 20A.

However, with the insulating material 38 being provided on a surface (lower surface) of the stage 29A opposing the first semiconductor chip 22A, even if the wires 28A touches the stage 29A, there is no risk of electrical connection between the wires 28A and the stages 29A. Thereby, an erroneous operation of the semiconductor device 20A or damage to the semiconductor chips 22A and/or 22B can be avoided.

The lead parts 30A, which are parts of the lead frame 31A, rest on the upper surface of the dam member 32. Therefore, the lead frame 31A is held on the multilayer printed circuit board 23 in a stable manner even before providing the sealing resin 25. In the present embodiment, the stage 29A and the lead parts 30A are coplanar.

The second semiconductor chip 22B and the lead parts 30A are electrically connected via the wires 28B (first electrical connection parts). Also, the lead parts 30A are electrically connected to the bonding pads 27 formed on the multilayer printed circuit board 23 via the wires 28C (second electrical connection parts). Thus, the second semiconductor chip 22B will be electrically connected to the multilayer printed circuit board 23 via the wires 28B, 28C and the lead parts 30A.

As has been described above, the semiconductor chip 22A is connected to the multilayer printed circuit board 23 by wires 28A and the semiconductor chip 22B is connected to the multilayer printed circuit board 23 via the wires 28B, 28C and the lead parts 30A. The wires 28A and 28C are bonded to bonding pads 27. The solder balls 24 are joined to electrodes 35 provided on the multilayer printed circuit 23. Also, the bonding pads 27 and electrodes 35 are connected via internal wirings formed inside the multilayer printed circuit board 23. Thus, each of the semiconductor chips 22A and 22B will be electrically connected to predetermined solder balls 24.

Each of the wires 28A to 28C is provided by a so-called reverse bonding process. That is to say, a first bonding step is implemented at a lower position and the second bonding step is implemented at a higher position. For the wire 28A, the first bonding step is implemented on the bonding pad 27 of the multilayer printed circuit board 23 and the second bonding step is implemented on the electrode of the first semiconductor chip 22A. For the wire 28B, the first bonding step is implemented on the lead part 30A and the second bonding step is implemented on the electrode of the second semiconductor chip 22B. For the wire 28C, the first bonding step is implemented on the bonding pad 27 of the multilayer printed circuit board 23 and the second bonding step is implemented on the lead part 30A. By providing the wires 28A to 28C using reverse bonding processes, heights of the wire loops of the wires 28A to 28C can be reduced. Accordingly, the thickness of the semiconductor device 30A can be reduced.

The sealing resin 25 is made of an insulating resin such as an epoxy resin. The sealing resin 25 is provided on one surface of the multilayer printed circuit board 23 so as to cover the semiconductor chips 22A, 22B, the lead frame 31A and the wires 28A to 28C. Thus, the semiconductor chips 22A, 22B, the lead frame 31A and the wires 28A to 28C will be protected by the sealing resin 25.

The sealing resin 25 is provided so as to fill the gap between the first semiconductor chip 22A and the second semiconductor chip 22B. Therefore, the stage 29A and the wires 28A are insulated by the sealing resin 25 as well as by the insulating material. Also, the sealing resin 25 is provided only on one side of the multilayer printed circuit board 23. Therefore, compared to the semiconductor device 1C of the related art (see FIG. 3), the semiconductor device 20A has achieved a compact structure and light weight while reducing the amount of sealing resin 25 used.

As has been described above, in the semiconductor device 20A, the first semiconductor chip 22A is mounted on the multilayer printed circuit board 23 and the second semiconductor chip 22B is placed over the first semiconductor chip 22A with a separation. Therefore, in a similar manner to that of the stacked CSP type semiconductor device 1D (see FIG. 4), the area of the multilayer printed circuit board 23 can be reduced to an area less than the total sum of area of the semiconductor chips 22A and 22B. Thus, the semiconductor device 20A has a miniaturized structure.

Also, as has been described above, the first semiconductor chip 22A and the second semiconductor chip 22B are electrically connected to the multilayer printed circuit board 23. The multilayer printed circuit board 23 has the internal wiring provided therein, and thus has a certain degree of freedom accommodating semiconductor chip the wiring patterns. That is to say, various wiring patterns can be provided between the bonding pads 27 on which the wire 28A or 28C connected to each of the semiconductor devices 22A and 22B is to be bonded and the electrodes 35 to be joined to the solder ball 24.

Therefore, even if general-purpose semiconductor chips having a predetermined pin layout (pin address) are used as the semiconductor chips 22A and 22B, such semiconductor chips will work with the internal wirings provided in the multilayer printed circuit board 23. There is no need to provide wiring for the wires 28A to 28C at an external part of the multilayer printed circuit board 23. Therefore, since the general-purpose semiconductor chips can be used as semiconductor chips 22A and 22B, the cost of the semiconductor device 20A can be reduced.

Also, the multilayer printed circuit board 23 may be of any type including a ceramic multilayer printed circuit board, a glass-epoxy multilayer printed circuit board, or a resin multilayer printed circuit board.

In the present embodiment, the first semiconductor chip 22A and the second semiconductor chip 22B are provided with a separation between each other. Therefore, the problem related to the difference between coefficients of thermal expansion of each of the semiconductor chips 22A and 22B can be prevented. Even if heat is applied to the semiconductor chips 22A and 22B when forming the sealing resin 25 and mounting the semiconductor device 20A, there will be no stress produced between the first semiconductor chip 22A and the second semiconductor chip 22B. Therefore, the semiconductor chips 22A and 22B will not interfere with each other, and thus the reliability of the semiconductor device 20A can be improved.

Further, in the present embodiment, the interposer includes the lead frame 31A and the wires 28B and 28C. The lead frame 31A is widely used as a component of semiconductor devices. Also, the wires 28B connecting the second semiconductor chip 22B and the lead parts 30A and the wires 28C connecting the lead parts 30A and the multilayer printed circuit board 23 are made of wires which can be wire-bonded by means of a well-known wire bonding machine. Therefore, the semiconductor device 20A can be manufactured without introducing new manufacturing equipment. Thus, the cost of the semiconductor device 20A can be reduced.

In the following, the second embodiment of the present invention will be described.

Figure 6:
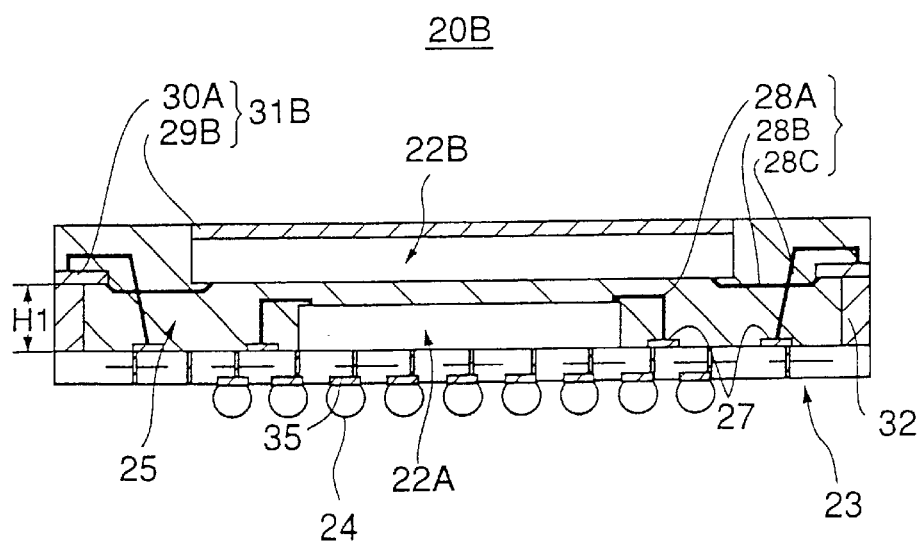
FIG. 6 is a cross-sectional diagram showing a second embodiment of a semiconductor device of the present invention.

FIG. 6 is a cross-sectional diagram showing a second embodiment of a semiconductor device 20B of the present invention. In FIG. 6, components which are the same as those of the semiconductor device 20A of the first embodiment illustrated in FIG. 5 are indicated with the same reference numbers, and detailed explanations thereof are omitted. This also applies to each of the embodiments described with reference to FIGS. 7 to 10.

In the case of the semiconductor device 20A of the first embodiment described with reference to FIG. 5, the circuit forming surface of the first semiconductor chip 22A opposes the stage 29A. On the contrary, the semiconductor device 20B of the present embodiment is characterised in that the circuit forming surface of the first semiconductor chip 22A opposes the circuit forming surface of the second semiconductor chip 22B.

With such a structure, a stage 29B of a lead frame 31B is placed at an outer surface of the semiconductor device 20B. Also, the lead parts 30A are separated from the multilayer printed circuit board 23 by the height H1, which height being the same as that of the semiconductor device 20A of the first embodiment. Therefore, the lead frame 31B of the present embodiment has a structure in which the stage 29B and the lead parts 30A are at different levels in a height-wise direction. Further, in the present embodiment, as shown in FIG. 6, the stage 29B is exposed, not covered by the sealing resin 25.

As in the present embodiment, when the circuit forming surface of the first semiconductor chip 22A opposes the circuit forming surface of the second semiconductor chip 22B, the wires 28B connecting the second semiconductor chip 22B and the lead parts 30A will form loops on the side opposing the first semiconductor chip 22A. Thus, the thickness of the sealing resin formed on the backside of the second semiconductor chip 22B can be reduced. Therefore, the thickness of the semiconductor device 20B can be reduced.

Particularly, when the stage 29B is exposed from the sealing resin 25 as in the present embodiment, the thickness of the semiconductor device 20B can be further reduced. Also, with the stage 29B being exposed from the sealing resin 25, the stage 29B serves as a heat-dissipating fin. Thus, the heat produced in the semiconductor chips 22A and 22B can be directly dissipated into external air. Thus, the heat dissipation characteristic of the semiconductor device 20B can be improved.

In the following, the third embodiment of the present invention will be described.

Figure 7:
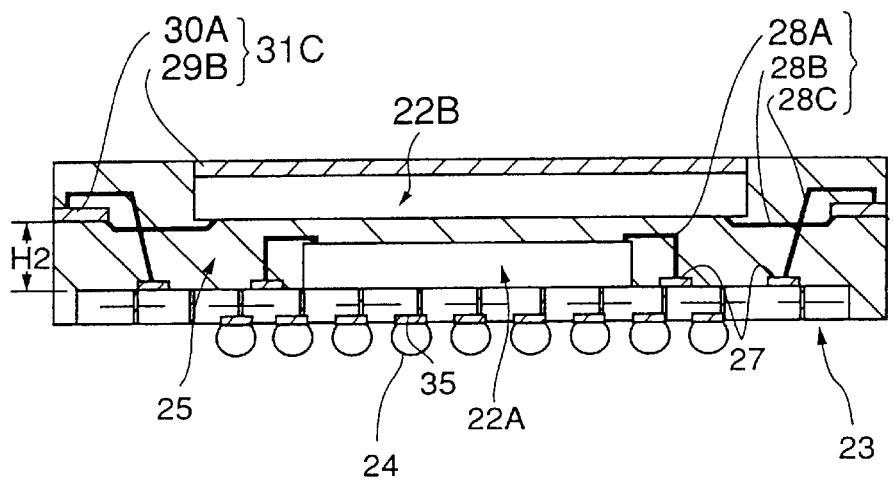
FIG. 7 is a cross-sectional diagram showing a third embodiment of a semiconductor device of the present invention.

FIG. 7 is a cross-sectional diagram showing a third embodiment of a semiconductor device 20C of the present invention. The semiconductor device 20C of the present embodiment is characterised in that the dam member 32 has been omitted, which dam member 32 being used for holding the lead frames 31A and 31B in the semiconductor devices 20A and 20B of the first and second embodiments, respectively. That is to say, in the present embodiment, a lead frame 31C is not directly fixed on the multilayer printed circuit board 23. (Practically, the sealing resin 25 fills the space between the lead frame 31C and the multilayer printed circuit board 23.) Thus, a number of components required for the semiconductor device can be reduced. A method of manufacturing the semiconductor device 20C will be described later.

In the following, the fourth embodiment of the present invention will be described.

Figure 8:
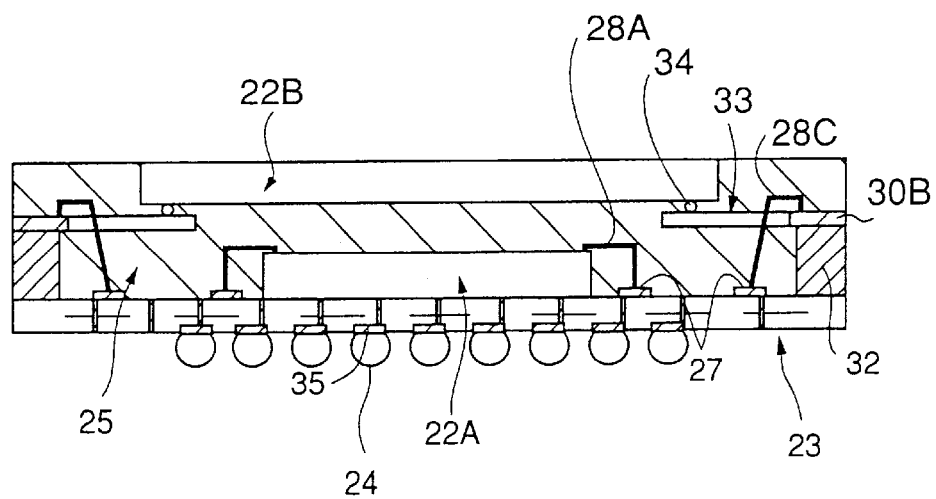
FIG. 8 is a cross-sectional diagram showing a fourth embodiment of a semiconductor device of the present invention.

FIG. 8 is a cross-sectional diagram showing a fourth embodiment of a semiconductor device 20D of the present invention. The semiconductor device 20D of the present embodiment is characterised in that the interposer includes a flexible printed circuit board such as a TAB (Tape Automated Bonding) substrate 33, the wires 28C and protruded electrodes such as stud bumps 34 (e.g., gold bump).

The TAB substrate 33 consists of a resin tape and wiring patterns provided thereon. Parts of the TAB substrate 33 (hereinafter referred to as lead parts 30B), are fixed on the top surface of the dam member 32 by means of an adhesive agent. Also, a part of the TAB substrate 33 extends to a position underneath the second semiconductor chip 22B. The stud bumps 34 are provided on the semiconductor chip 22B at a position corresponding to the protruded part of the TAB substrate 33. Thus, the second semiconductor chip 22B can be flip-chip bonded on the TAB substrate 33. Also, the wires 28C are provided between the lead parts 30B of the TAB substrate 33 and the bonding pads 27 formed on the multilayer printed circuit board 23. Thus, the second semiconductor chip 22B is electrically connected to the multilayer printed circuit board 23 via the stud bumps 34 (first electrical connection parts), the TAB substrate 33, and the wires 28C (second electrical connection parts).

For the TAB substrate 33, the wiring pattern can be made by a thin-film forming technique. Therefore, the wiring pattern can be formed with a smaller pitch compared to the pitch of previously described embodiments (see FIGS. 5, 6 and 7). Therefore, by using the TAB substrate 33 as a part of the interposer, semiconductor chips 22A and 22B having a high density and an increased number of electrodes can be used.

Also, the TAB substrate 33 can be made of TAB tape widely used as a component of the semiconductor device.

Also, the stud bumps 34 connecting the second semiconductor chip 22B and the lead parts 30B and the wires 28C connecting the lead parts 30B and the multilayer printed circuit board 23 can be made of those stud bumps and wires which are widely used as components of the semiconductor device. Therefore, the semiconductor device 20D can be manufactured without introducing new manufacturing equipment. Thus, the cost of the semiconductor device 20D can be reduced.

In the following, a method of manufacturing the semiconductor devices 20A to 20D will be described. The following description particularly relates to the semiconductor device 20B of the second embodiment shown in FIG. 6 and the semiconductor device 20C of the third embodiment shown in FIG. 7.

FIGS. 9A to 9E are cross-sectional diagrams showing various steps of manufacturing the semiconductor device 20B of the second embodiment of the present invention.

Before manufacturing the semiconductor device 20B, the lead frame 31B is prepared in a separate step (lead frame forming step). The lead frame 31B has the stage 29B and the lead parts 30A.

Then, as shown in FIG. 9A, the second semiconductor chip 22B is mounted on the lead frame 31B. In detail, the second semiconductor chip 22B is die bonded on the stage 29B by means of an adhesive agent (not shown). Then the wires 28B (first electrical connection parts) are wire bonded between the second semiconductor chip 22B mounted on the stage 29B and the lead parts 30A. The above-described processes are referred to as a second semiconductor chip mounting step.

The lead frame 31B used in the present embodiment has a structure such that the stage 29B and the lead parts 30A are at different levels in a height-wise direction. In the lead frame forming step, a plate-like base material is pressed such that the base material is cut or plastically deformed into the lead frame 31B of a predetermined shape. Therefore, the lead frame 31B having the stage 29B and the lead parts 30A provided at different levels in a height-wise direction can be manufactured quite easily.

As shown in FIG. 9B, the first semiconductor chip 22A is mounted on an upper surface of the multilayer printed circuit board 23 using an adhesive agent (not shown). The multilayer printed circuit board 23 has been manufactured in a separate step. The multilayer printed circuit board 23 is provided with the bonding pads 27 on its upper surface and with the electrodes 35 on its lower surface. Also, internal wiring is provided between the bonding pads 27 and the electrodes 35.

After the first semiconductor chip 22A has been mounted on the upper surface of the multilayer printed circuit board 23, the wires 28A are wire bonded between electrodes provided on a peripheral part of the circuit forming surface of the first semiconductor chip 22A and the bonding pads 27. This wire bonding process is a reverse wire bonding process in which a first bonding is implemented on the bonding pad 27 and the second bonding is implemented on the first semiconductor chip 22A. Thus, the height of the loop of the wires 28A can be reduced.

After the wire bonding process, one or more am members (holding member) 32 is provided on the multilayer printed circuit board 23 at a position peripheral to the position of the first semiconductor chip 22A. The dam member 32 may be made of an insulative resin. The dam member 32 is fixed on the multilayer printed circuit board 23 by means of an adhesive agent (not shown). The processes indicated in FIG. 9B are referred to as a first semiconductor chip mounting step.

It is to be noted that the first semiconductor chip mounting step and the second semiconductor chip mounting step can be implemented in any order, and that it is also possible to implement both steps simultaneously. Also, the distance of separation between the first semiconductor chip 22A and the second semiconductor chip 22B can be set to any distance by adjusting the height of the dam member 32.

Then, as shown in FIG. 9C, the lead parts 30A of the lead frame 31B on which the second semiconductor chip 22B is mounted are fixed on the upper surface of the dam member 32. Thus, the lead frame 31B will be held on the dam member 32 (lead frame holding step). The lead frame 31B is provided on the dam member 32 such that the circuit forming surface of the first semiconductor chip 22A opposes the circuit forming surface of the second semiconductor chip 22B. That is to say, FIG. 9C shows the lead frame 31B in a reversed position to that of FIG. 9A.

Then, as shown in FIG. 9D, the wires 28C are wire bonded on the lead parts 30A and the bonding pads 27 of the multilayer printed circuit board 23 (connecting step). The wires 28C are provided by reverse bonding in which the first bonding step is implemented on the bonding pads 27 and the second bonding step is implemented on the lead parts 30A. Thus, the heights of the wire loops of the wires 28C can be reduced.

Then, as shown in FIG. 9E, the sealing resin 25 is applied such that the first and second semiconductor chips 22A and 22B, the lead frame 31B and the wires 28A to 28C are sealed and the separation between the first semiconductor chip 22A and the second semiconductor chip 22B is filled by the sealing resin (resin sealing step). In the present embodiment, the resin sealing step is implemented such that the stage 29B is exposed from the sealing resin 25. This can be easily achieved by molding the resin while the stage 29B is in contact with a mold used for forming the sealing resin 25.

Then, the multilayer printed circuit board 23, the dam member 32, the lead frame 31B and the sealing resin 25 are diced along predetermined lines. Then, the solder bumps 24 are provided on the electrodes 35 formed on the lower surface of the multilayer printed circuit board 23 (terminal forming step). Thus, the semiconductor device 20B shown in FIG. 9E is manufactured.

With the above-described manufacturing method, after the first and second semiconductor chip mounting steps, the lead frame 31B is held on the multilayer printed circuit board 23 by means of the dam member 32 such that there is a separation between the first semiconductor chip 22A and the second semiconductor chip 22B. Therefore, subsequent steps including the connection step and the resin sealing step can be implemented in a state where the second semiconductor chip 22B is held above the first semiconductor chip 22A. Thus, the manufacturing processes can be facilitated.

In the following, a method of manufacturing the semiconductor device 20C of the third embodiment will be described with reference to FIGS. 10A to 10E. The basic manufacturing steps of the method of manufacturing the semiconductor device 20C of the third embodiment is the same as those of the method of manufacturing the semiconductor device 20B of the second embodiment. Therefore, in the following description, detailed descriptions will be made on the processes different from the method of manufacturing the semiconductor device 20B of the second embodiment.

Before manufacturing the semiconductor device 20C, the lead frame 31C is prepared is a separate step (lead frame forming step). The lead frame 31C has the stage 29B, the lead parts 30A and bent parts 36.

Figure 10A:
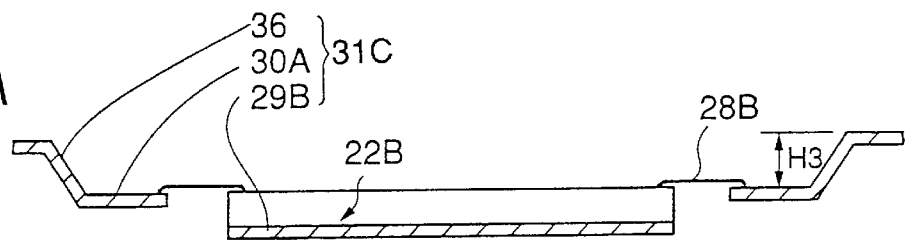
FIGS. 10A to 10E are cross-sectional diagrams showing various steps of manufacturing the semiconductor device of the third embodiment of the present invention.

Then, as shown in FIG. 10A, the second semiconductor chip 22B is mounted on the stage 29B of the lead frame 31C. Then the wires 28B (first electrical connection parts) are wire bonded between the second semiconductor chip 22B mounted on the stage 29B and the lead parts 30A. The processes indicated in FIG. 9A are referred to as a second semiconductor chip mounting step.

The bent parts 36 are formed in the lead frame forming step such that a dimension shown by an arrow H3 will be equal to the height H2 (shown in FIG. 7), which is a separation between the multilayer printed circuit board 23 and the lead parts 30A (H2=H3).

As has been described above, in the lead frame forming step, a plate-like base material is pressed such that the base material is cut or plastically deformed into the lead frame 31B of a predetermined shape. Therefore, the lead frame 31B having the stage 29B and the lead parts 30A provided at different levels in a height-wise direction and also having bent parts 36 can be manufactured quite easily.

Figure 10B:
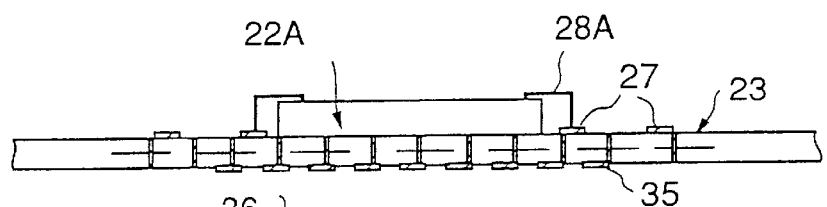

FIG. 10B is a diagram showing a first semiconductor chip mounting step. This step is similar to the step shown in FIG. 9B, except that the dam member 32 is not provided. Therefore, the detailed description is omitted.

Figure 10C:
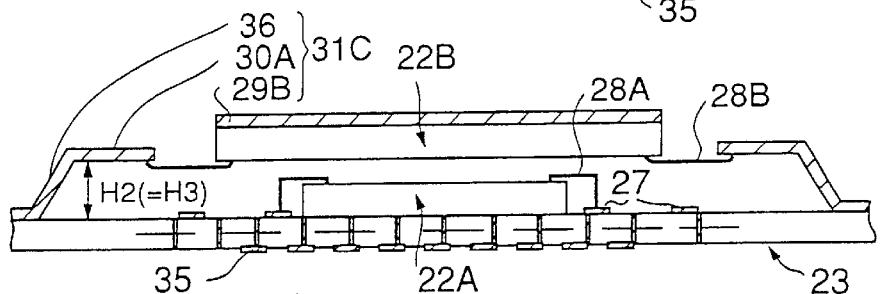

Then, as shown in FIG. 10C, the lead frame 31C on which the second semiconductor chip 22B is mounted is fixed on the upper surface of the multilayer printed circuit board 23 using an adhesive agent (lead frame holding step). The lead frame 31C is provided on the multilayer printed circuit board 23 such that it is in a reversed (upside-down) position to the lead frame 31C of FIG. 10A.

Thus, the bent parts 36 provided on the lead frame 31C will serve as leg parts which hold the second semiconductor chip 22B with a separation from the first semiconductor chip 22A. That is to say, the lead frame 31C will hold the second semiconductor chip 22B, so that there is no need for a holding member such as the dam member 32. Further, as shown in FIG. 10A, the bent parts 36 have a level difference of H3 (=H2). Therefore, the distance of separation between the circuit forming surface of the semiconductor chip 22B and the multilayer printed circuit board 23 will be H2.

Figure 10D:
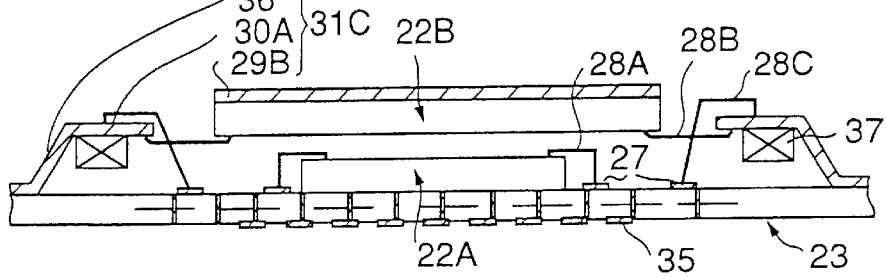

Then, as shown in FIG. 10D, the wires 28C are wire-bonded on the lead parts 30A and the bonding pads 27 of the multilayer printed circuit board 23 (connecting step). In the present embodiment, the lead parts 30A are not fixed to the multilayer printed circuit board 23. Therefore, for a secure wire bonding, a reinforcement member 37 is inserted under the lead parts 30A. This reinforcement member 37 is removed after the wire bonding process is completed.

Figure 10E:
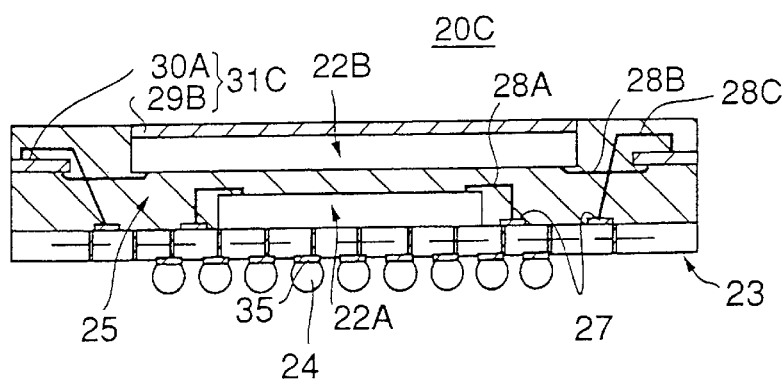

After the connection step, subsequent steps such as the resin sealing step and the terminal forming step are implemented. Thus, the semiconductor device 20C shown in FIG. 10E is manufactured.

With the above-described manufacturing method, in a similar manner to the manufacturing method of FIGS. 9A to 9E, the second semiconductor chip 22B is held with a separation between the first semiconductor chip 22A and the second semiconductor chip 22B. Therefore, subsequent steps including the connection step and the resin sealing step can be implemented quite easily. Further, since the bent part 36 of the lead frame 31C is used as a holding means for holding the second semiconductor chip 22B with a separation to the first semiconductor chip 22A, the number of components can be reduced.

Further, the present invention is not limited to these embodiments, but variations and modifications may be made without departing from the scope of the present invention.

The present application is based on Japanese priority application No. 11-69013 filed on Mar. 15, 1999, the entire contents of which are hereby incorporated by reference.

What is claimed is:

1. A semiconductor device comprising:

a first semiconductor chip;

a second semiconductor chip;

a multilayer printed circuit board having a first surface whereon said first semiconductor chip is mounted and a second surface whereon external connection terminals are provided;

an interposer; and a sealing resin for sealing said first and second semiconductor chips and said interposer, wherein said interposer comprises: a lead frame having a stage whereon said second semiconductor chip is mounted and lead parts to be electrically connected to said second semiconductor chip; first electrical connection parts electrically connecting said second semiconductor chip and said lead parts; and second electrical connecting said lead parts and said multilayer printed circuit board, wherein said interposer holds said second semiconductor chip above said first semiconductor chip such that there is a separation between the first semiconductor chip and the second semiconductor chip while electrically connecting said second semiconductor chip and said multilayer printed circuit board, a holding member which holds said lead frame on said multiplayer printed circuit board, and said sealing resin is formed so as to fill the separation between said first semiconductor chip and said second semiconductor chip.

2. The semiconductor device as claimed in claim 1, wherein said first electrical connection parts and said second electrical connection parts are both configured as wires.

3. The semiconductor device as claimed in claim 1, wherein said first electrical connection parts are configured as protruded electrodes and said second electrical connection parts are configured as wires.

4. The semiconductor device as claimed in claim 1, wherein said stage is positioned so as to oppose said first semiconductor chip, and a surface of said stage which opposes said first semiconductor chip is provided with an insulating material.

5. The semiconductor device as claimed in claim 1, wherein a circuit forming surface of said first semiconductor chip is positioned so as to oppose a circuit forming surface of said second semiconductor chip.

6. The semiconductor device as claimed in claim 5, wherein said stage is exposed from said sealing resin.

* * * * *